(12) United States Patent
Mansoori et al.

(10) Patent No.: US 7,199,011 B2
(45) Date of Patent: Apr. 3, 2007

(54) METHOD TO REDUCE TRANSISTOR GATE TO SOURCE/DRAIN OVERLAP CAPACITANCE BY INCORPORATION OF CARBON

(75) Inventors: Majid Movahed Mansoori, Plano, TX (US); Alwin Tsao, Garland, TX (US); Antonio Luis Pacheco Rotondaro, Dallas, TX (US); Brian Ashley Smith, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/620,492

(22) Filed: Jul. 16, 2003

(65) Prior Publication Data

US 2005/0014353 A1 Jan. 20, 2005

(51) Int. Cl.
*H01L 21/336* (2006.01)
(52) U.S. Cl. ............... 438/270; 438/299; 438/303; 257/E21.092; 257/E21.115
(58) Field of Classification Search ............ 438/301, 438/592, 233, 588, 590, 591, 270, 299, 303, 438/157; 257/E21.092, E21.127, E21.115
See application file for complete search history.

(56) References Cited

U.S. PATENT DOCUMENTS 5,397,909 A * 3/1995 Moslehi .............. 257/383
5,998,289 A * 12/1999 Sagnes ................ 438/592
6,541,320 B2 4/2003 Brown et al.
6,686,637 B1 * 2/2004 Dokumaci et al. ...... 257/412
2002/0048918 A1 4/2002 Grider et al.
2003/0032225 A1 2/2003 Brown et al.

* cited by examiner

Primary Examiner—Walter L. Lindsay, Jr.
(74) Attorney, Agent, or Firm—Jacqueline J. Garner; W. James Brady, III; Frederick J. Telecky, Jr.

(57) ABSTRACT

The present invention pertains to formation of a transistor in a manner that mitigates overlap capacitances, thereby facilitating, among other things, enhanced switching speeds. More particularly, a gate stack of the transistor is formed to include an optional layer of poly-SiGe and a layer of poly-Si, where at least one or the layers comprises carbon. The stack may also include a polysilicon seed layer that can also comprise carbon. The carbon changes the components of sidewall passivation materials and affects etch rates during an etching process, thereby facilitating isotropic etching. The changed passivation materials coupled with an enhanced sensitivity of the poly-SiGe and carbon-doped poly-SiGe layer to an etchant utilized in the etching process causes the stack to have a notched appearance. The tapered configuration of the gate stack provides little, if any, area for dopants that may migrate under the gate structure to overlap the conductive layers in the stack, and thus mitigates the opportunity for overlap capacitances to arise.

19 Claims, 17 Drawing Sheets

METHOD TO REDUCE TRANSISTOR GATE TO SOURCE/DRAIN OVERLAP CAPACITANCE BY INCORPORATION OF CARBON

FIELD OF INVENTION

The present invention relates generally to semiconductor processing, and more particularly to a methodology for reducing gate to source/drain capacitance in a transistor via inclusion of carbon in a gate structure.

BACKGROUND OF THE INVENTION

Several trends exist presently in the semiconductor and electronics industry. Devices are continually getting smaller, faster and requiring less power. A reason for these trends is that more personal devices are being fabricated that are relatively small and portable, thereby relying on a battery as their primary supply source. For example, cellular phones, personal computing devices, and personal sound systems are devices in great demand in the consumer market. In addition to being smaller and more portable, personal devices are requiring more computational power and speed. In light of all these trends, there is an ever increasing demand in the industry for smaller and faster transistors used to provide the core functionality of the integrated circuits used in these devices.

Accordingly, in the semiconductor industry there is a continuing trend toward manufacturing integrated circuits (ICs) with higher densities. To achieve high densities, there has been and continues to be efforts toward scaling down dimensions (e.g., at submicron levels) on semiconductor wafers, which are generally produced from bulk silicon. In order to accomplish such high densities, smaller feature sizes, smaller separations between features and more precise feature shapes are required in integrated circuits (ICs) fabricated on small rectangular portions of the wafer, commonly known as dies. This may include the width and spacing of interconnecting lines, spacing and diameter of contact holes, as well as the surface geometry of various other features (e.g., corners and edges). The scaling-down of integrated circuit dimensions can facilitate faster circuit performance and/or switching speeds, and can lead to higher effective yield in IC fabrication by providing more circuits on a die and/or more die per semiconductor wafer.

The process of manufacturing integrated circuits typically consists of more than a hundred steps, during which hundreds of copies of an integrated circuit can be formed on a single wafer. This process can create electrically active regions in and on the semiconductor wafer surface. In MOS transistors, for example, a gate structure is created, which can be energized to establish an electric field within a semiconductor channel, by which current is enabled to flow between a source region and a drain region within the transistor. The source and drain regions facilitate this conductance by virtue of carefully tailored doping to form positively doped (p) or negatively doped (n) regions around the channel.

As device sizes continue to shrink, however, capacitive effects may become noticeable and/or problematic. There are a number of extrinsic capacitances associated with a MOS transistor. For example, ion implantation is utilized to create the source and drain regions, as well as source and drain extension regions in the transistor. A high temperature anneal is subsequently employed to activate the implanted dopants. This high temperature anneal can cause lateral diffusion of the implanted species such that some of the dopants can migrate under the gate structure.

These overlap regions can give rise to "overlap capacitances" since the gate structure includes a conductive layer overlying a dielectric material, and the dielectric material, in turn, is situated over the diffused conductive dopants. The value of the overlap capacitance depends upon the area or degree of overlap between the gate structure and the diffused dopants, among other things. Accordingly, as scaling occurs and the size of the gate structure is reduced, the percentage of overlapping area increases and the overlap capacitance increases, becoming a larger percentage of the total overall transistor capacitance. This can result in a reduction in transistor and IC performance, such as by reducing or otherwise adversely affecting transistor switching speeds.

Accordingly, improved techniques for fabricating densely packed semiconductor devices would be desirable. More particularly, it would be desirable to fabricate semiconductor devices in a manner that reduces overlap capacitances and allows for faster switching speeds.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention pertains to formation of a transistor in a manner that mitigates overlap capacitance, thereby facilitating, inter alia, enhanced switching speeds. More particularly, a gate stack of the transistor includes an optional poly-SiGe layer and a poly-Si layer, where at least one of the layers comprises carbon. The stack may also include a polysilicon seed layer that can also comprise carbon. The carbon changes the formation of passivation materials during etching, and thereby facilitates isotropic etching. The carbon, coupled with an enhanced sensitivity of the poly-SiGe layer to an etchant utilized to carve out the gate stack, causes the stack to have a notched cross-section. This tapered configuration of the stack provides little, if any, area for migrant dopants to overlap the conductive layers in the gate stack, and thus mitigates the opportunity for overlap capacitance to occur.

According to one aspect of the present invention, a method of forming a transistor having source and drain regions within a substrate adjacent to a gate stack on the substrate is disclosed. The method includes forming a layer of poly-SiGe with carbon over a dielectric layer situated on the substrate. The method further includes forming a layer of poly-Si over the layer of poly-SiGe, and patterning the poly-Si, poly-SiGe and dielectric layers to form the gate stack.

In accordance with one or more other aspects of the present invention, a method of forming a transistor includes forming a layer of dielectric material over a substrate, forming a layer of poly-SiGe with carbon over the dielectric layer and forming a layer of poly-Si over the layer of poly-SiGe. The poly-Si, poly-SiGe and dielectric layers are then patterned to form a gate stack. Exposed portions of the substrate adjacent to the gate stack are then doped to form source and drain regions within the substrate.

According to one or more other aspects of the present invention, a method of forming a transistor having source and drain regions within a substrate adjacent a gate stack on the substrate is also disclosed. The method includes forming a layer of poly-Si with carbon in a portion thereof over a dielectric layer situated on the substrate and then patterning the poly-Si and dielectric layers to form the gate stack. Having carbon in a bottom portion of the poly-Si layer causes variations in an amount of sidewall passivation during etching, resulting in a notched poly-Si gate structure that may be employed to reduce overlap capacitance.

According to one or more other aspects of the present invention, a transistor includes a gate structure formed over a substrate. The gate structure includes a dielectric layer over the substrate, a poly-SiGe layer with carbon over the dielectric layer and a poly-Si layer over the poly-SiGe layer. The transistor also includes dopant implanted into the substrate adjacent the gate structure to form source, drain, source extension and drain extension regions. A channel region is defined under the gate structure wherein some of the dopant may drift as a result of heat treatment.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
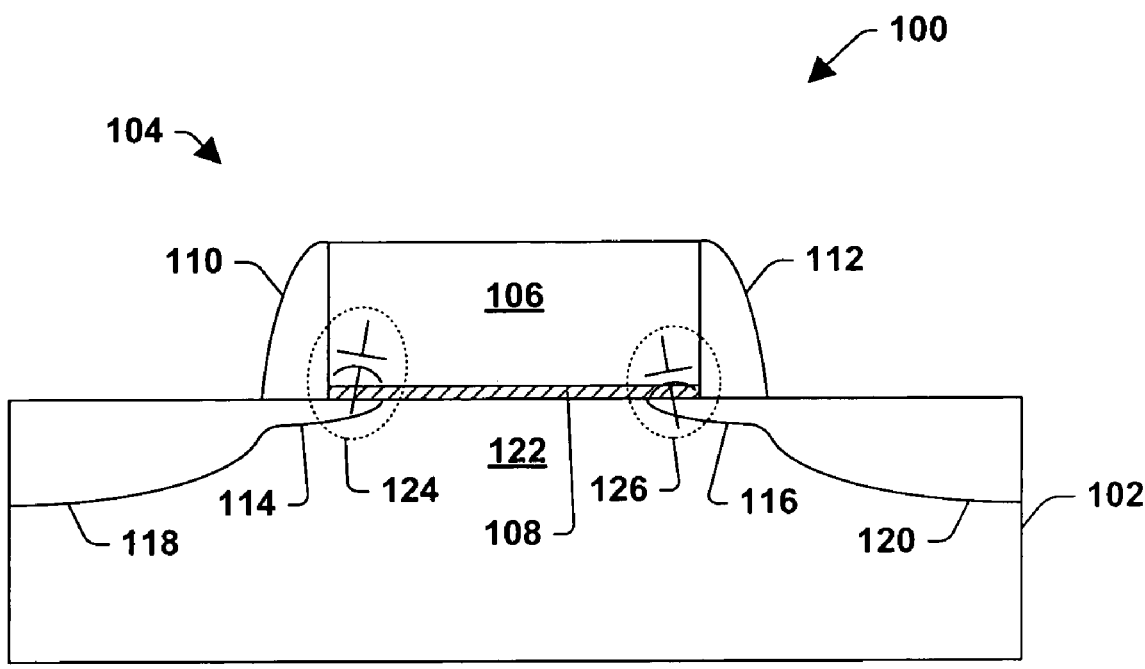
FIG. 1 is a simplified, schematic cross-sectional illustration of a conventional transistor.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

The present invention pertains to formation of a transistor in a manner that mitigates gate-to-source and/or gate-to-drain overlap capacitance, thereby facilitating, among other things, enhanced switching speeds. More particularly, a gate stack of the transistor is formed to include an optional poly-SiGe layer and a poly-Si layer, where at least one of the layers comprises carbon. The stack may also include a polysilicon seed layer that can also comprise carbon. The carbon changes the horizontal, or lateral, etch rate of the layer(s) thereby facilitating isotropic etching. The carbon, coupled with an enhanced sensitivity of the poly-SiGe later to an etchant utilized in the etching process, causes the stack to have a notched cross-section. This tapered configuration provides little, if any, area for migrant dopants to overlap the conductive layers in the stack, and thus mitigates the opportunity for overlap capacitance to occur.

In order to appreciate various aspects of the present invention, a brief description of a conventional MOS device and fabrication process follows below. FIG. 1 illustrates a conventional semiconductor transistor device 100 that can be fabricated with conventional complimentary MOS (CMOS) processing techniques in a semiconductor substrate 102. The device 100 includes a gate structure 104 comprising a gate electrode 106 and a gate dielectric 108. The gate electrode 106 generally comprises polysilicon and overlies the gate dielectric 108. Sidewall spacers 110, 112 are located upon either side of the gate structure 104. As will be discussed further, the sidewall spacers 110, 112 impede doping of certain areas or extension regions 114, 116 underlying the spacers 110, 112. Two laterally spaced doped source/drain regions 118 and 120 are formed within the substrate 102 and a channel region 122 is defined therebetween under the gate structure 104.

In operation, the resistivity of the channel 122 may be controlled by a voltage applied to the gate electrode 106, where changing the gate voltage changes the amount of current flowing through the channel 122 between the source and drain 118, 120. The gate contact or electrode 106 and the channel 122 are separated by the gate dielectric 108, which is an insulator and which opposes current flow between the gate electrode 106 and the channel 122, such that the device does not become activated until a sufficient voltage (at least larger than a threshold voltage $V_t$) is applied to the gate electrode 106.

It will be appreciated that dopants from the extension regions 114, 116 (and potentially from the source and drain regions 118, 120 as well) may migrate under the gate structure 104 into the channel 122 during a high temperature anneal subsequently performed to activate the dopants. These laterally diffused dopants can give rise to overlap capacitances 124, 126 (encircled in phantom) since the diffused dopants and the conductive gate electrode 106 are separated by the nonconductive gate dielectric 108. Thus, these layers serve as parallel plates wherein charge can build up and/or be discharged. These capacitive effects can be detrimental to the operation of the transistor 100. For example, overlap capacitance may reduce switching speeds, which is an important attribute of transistor performance.

Figure 2:
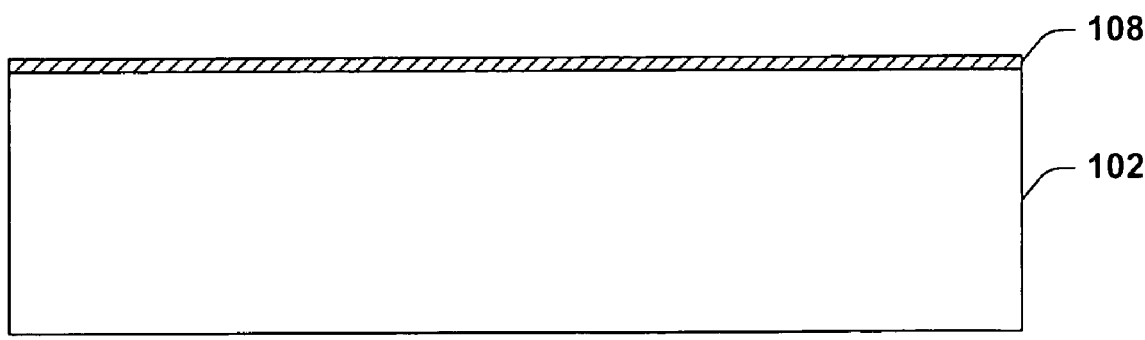
FIG. 2–8 are cross-sectional illustrations depicting a conventional methodology for forming a transistor, such as that presented in FIG. 1.
Figure 3:
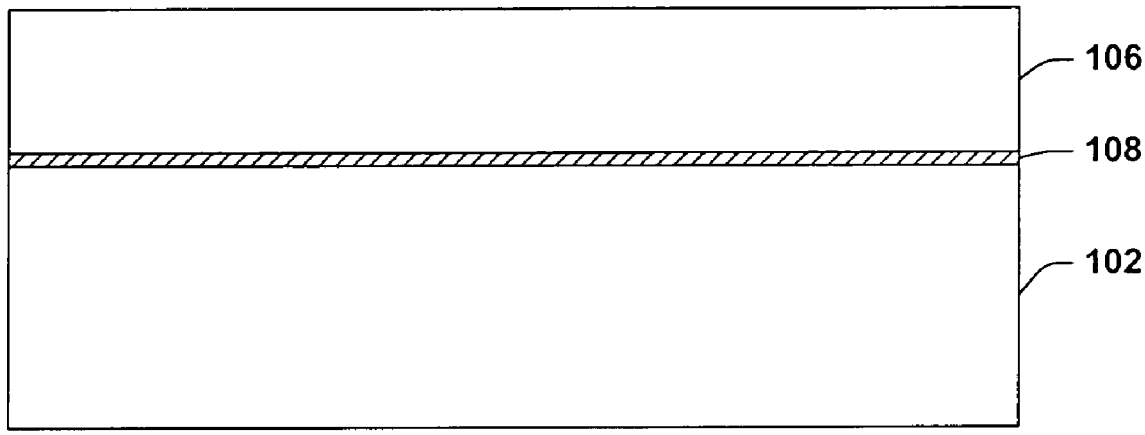
Figure 4:
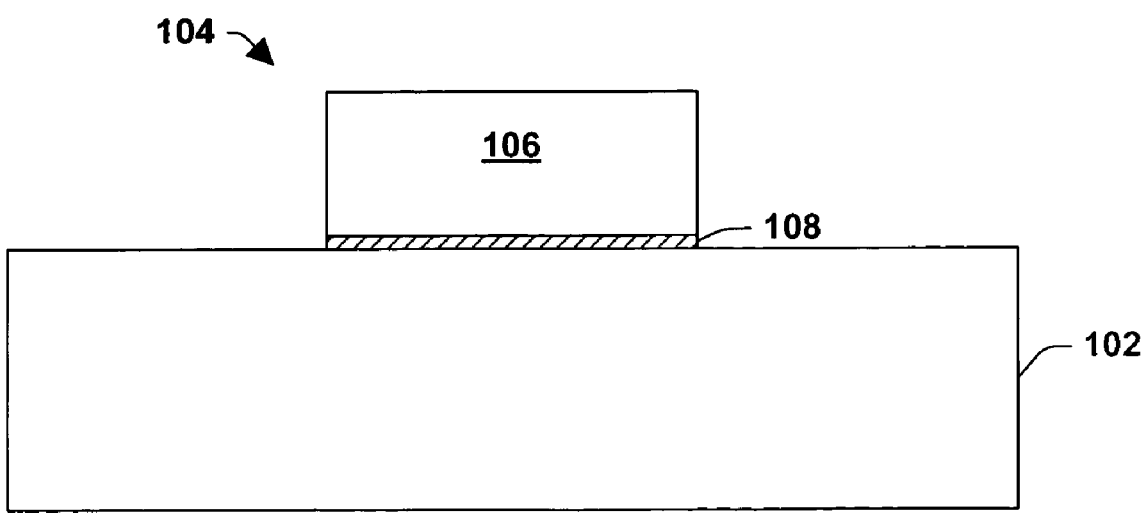
Figure 5:
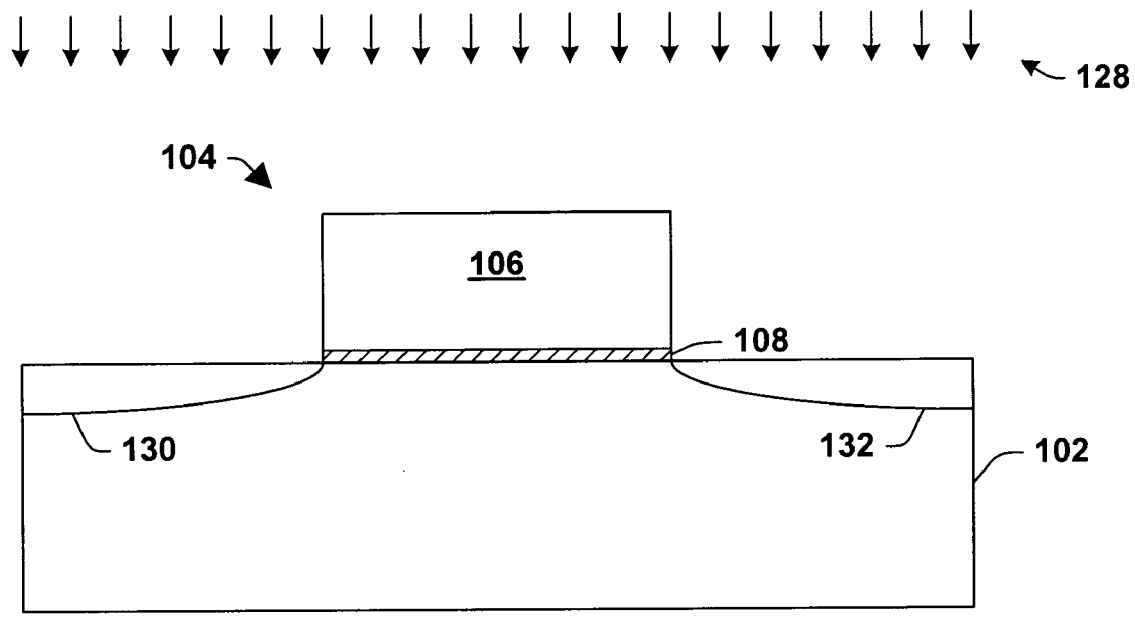

To form the device 100, a layer of dielectric material 108 such is silicon dioxide is initially formed over the substrate 102 (FIG. 2). A gate electrode layer 106 (e.g., polysilicon) is then formed over the layer of dielectric material 108 (FIG. 3). The gate electrode layer 106 and the layer of dielectric material 108 are then patterned (e.g., via etching) to develop the gate structure 104 (FIG. 4). Dopant 128 is then applied to the gate electrode 106 (e.g., via implantation) and to exposed portions of the substrate 102 to form extension regions 130, 132 therein (FIG. 5). As will become apparent, the extension regions 130, 132 are precursors to portions of the source and drain regions 118, 120 formed within the substrate 102.

Figure 6:
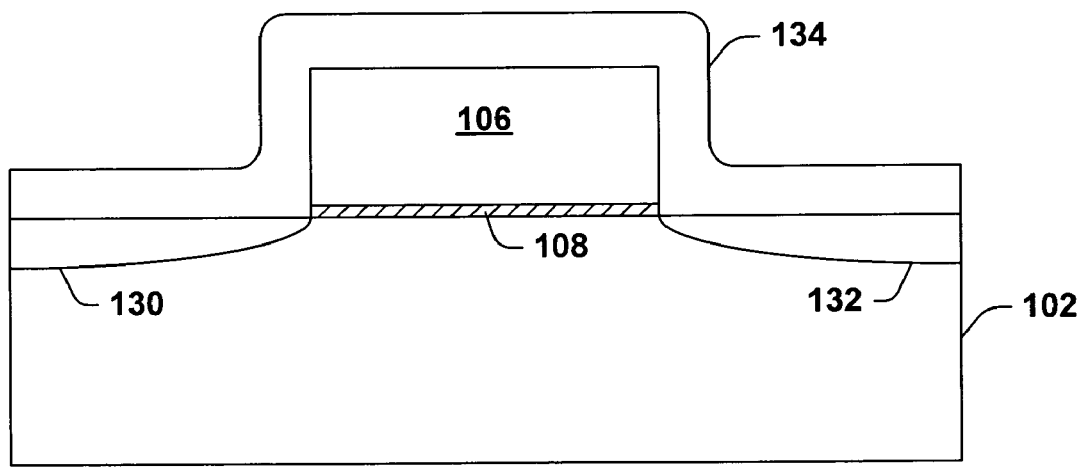
Figure 7:
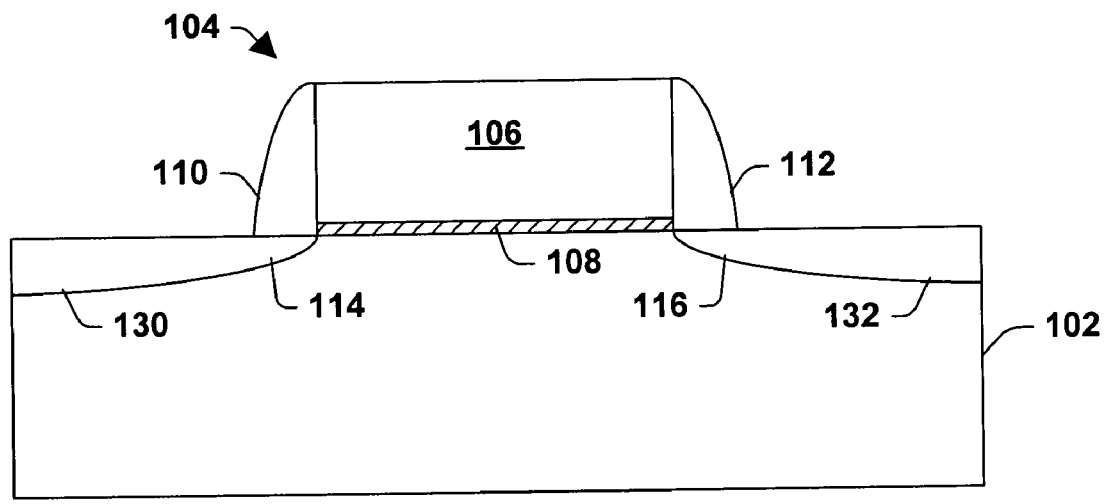
Figure 8:
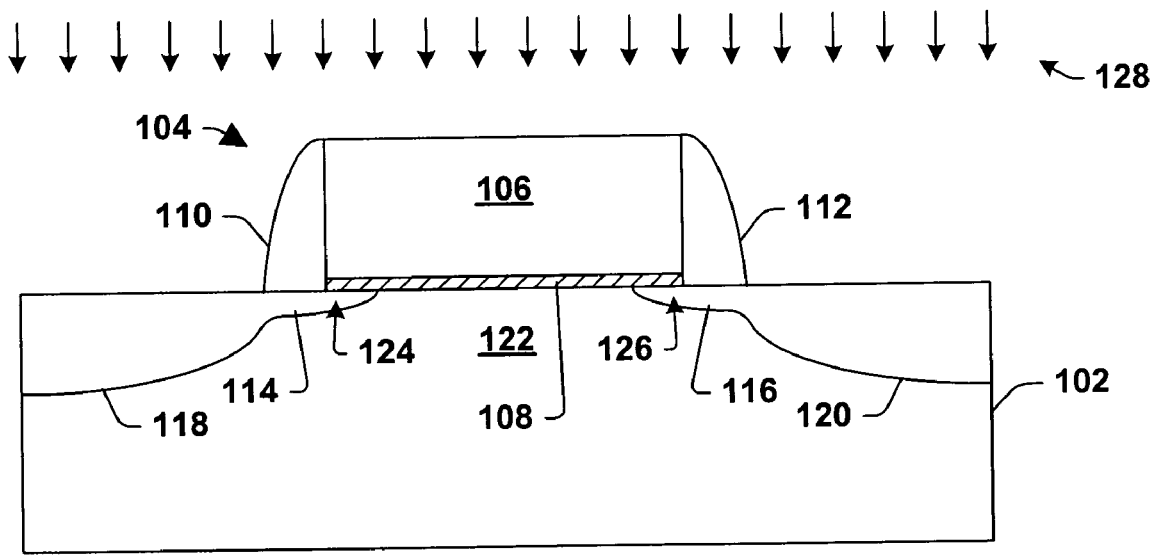

A layer of an insulating material 134 (e.g., silicon nitride, silicon oxide) is then formed over the entire structure (FIG. 6). The layer of insulating material 134 is selectively removed (e.g., via anisotropic etching) to form the sidewall spacers 110, 112 on either side of the gate structure 104 (FIG. 7). Additional dopant 128 is then applied to the gate electrode 106 and the substrate 102, except for those portions 114, 116 covered by the sidewall spacers 110, 112 (FIG. 8). The additional dopant 128 establishes the source and drain regions 118, 120 within the substrate 102 on either side of the gate structure 104. It will be appreciated that the additional dopant 128 is of substantially the same type as that previously applied in forming the extension regions 130, 132 (e.g., FIG. 5). The channel region 122 is thereby defined within the substrate 102 under the gate structure 104 as the source and drain regions 118, 120 are formed within the substrate 102 (FIG. 8).

It will be appreciated that the transistor is also subjected to some type of annealing or other high temperature processing during formation. This heat treatment serves to, among other things, activate dopant species utilized to create the extension regions 114, 116 and the source and drain regions 118, 120 in the substrate 102. However, in activating these substances, some of the dopant can migrate into the channel region 122 under the gate structure 104 as indicated at 124 and 126. This can give rise to capacitive effects as discussed above whereby the conductive dopants can act as conductive plates that are in parallel with the nonconductive gate dielectric 108 and the conductive gate electrode 106.

While not wishing to be limited to any particular theory, the inventors of the present invention have found that by adding carbon to a portion of the gate structure, an amount of sidewall etching may be manipulated to tailor a shape of the gate structure in order to reduce an amount of gate-to-drain and/or gate-to-source overlap capacitance. It is believed that the carbon incorporation into the gate structure impacts sidewall passivation material formation during formation of the gate. A brief discussion of the hypothesis follows below.

Figure 9:
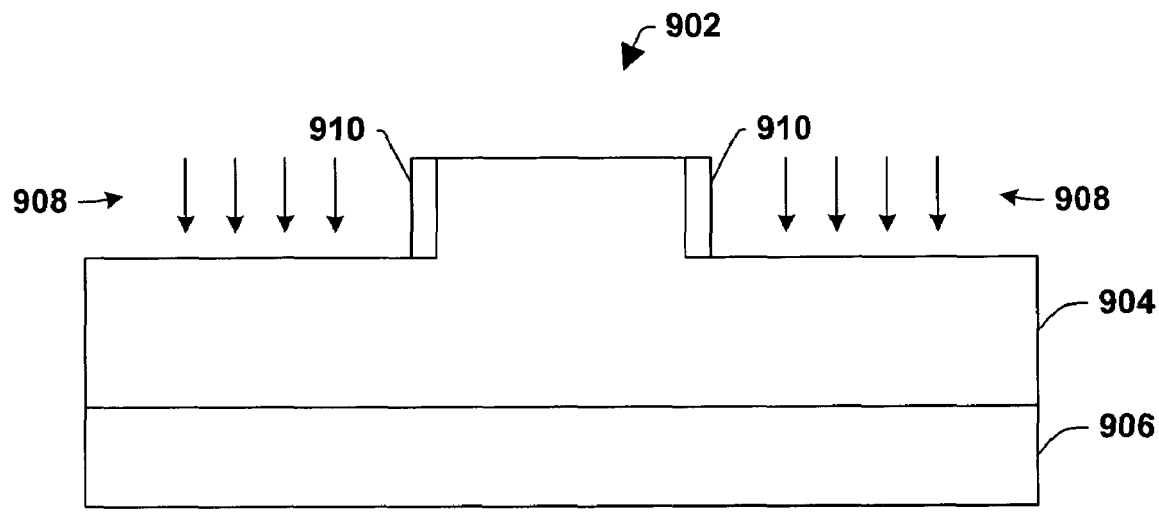
FIG. 9–14 are cross-sectional illustrations depicting the effects that carbon can have on an etching process, as well as the effects that using a material (e.g., SiGe) that has a heightened sensitivity to an etchant utilized in the process can have on the etching process.
Figure 10:
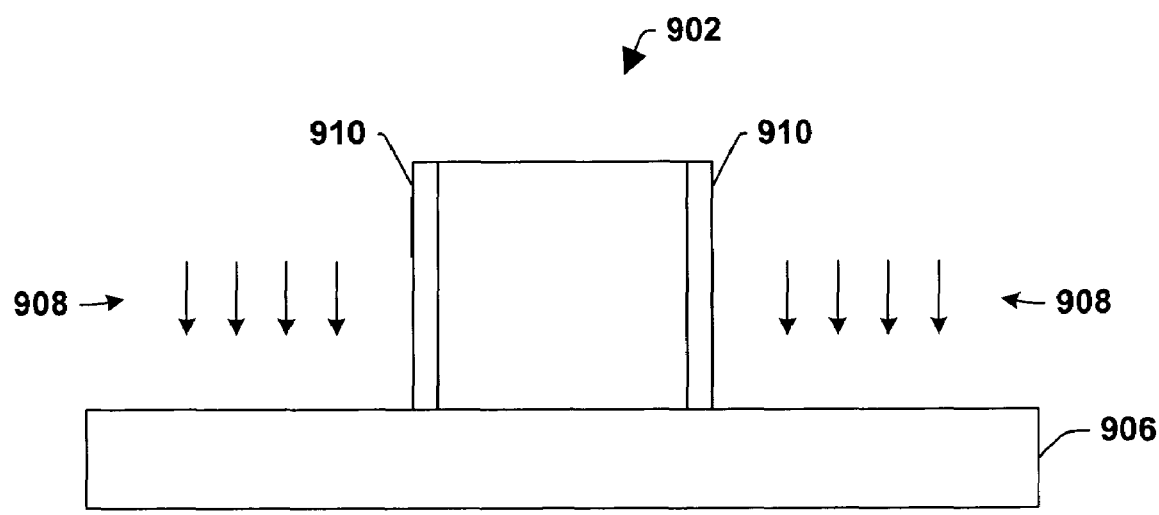

Turning to FIG. 9, it will be appreciated that a passivation material may form along sidewalls of a structure being etched. For instance, in the illustrated example a gate structure 902 is being formed out of a material 904 and a polysilicon seed layer 906 overlying a substrate 908 via a dry etch process 910 that utilizes a dry plasma etchant, for example. The gate structure 902 has a passivation material 912 forming along the sidewalls thereof as the material 904 and seed layer 906 are etched away. The passivation material 912 may be a by-product of the etching process 910 and is generally resistive to the etchant. An anisotropic dry etch process results from both an anisotropic velocity distribution of ions making up the dry etch plasma, as well as this passivation layer 912 that inhibits etching of the vertical sidewalls. As such, horizontal etching is inhibited and the material 904 and seed layer 906 are generally anisotropically etched in the vertical direction to form the gate structure 902 as illustrated in FIG. 10. It will be appreciated that a dielectric layer is omitted from FIGS. 9 and 10, and FIGS. 11–14 for simplicity and ease of understanding.

Figure 11:
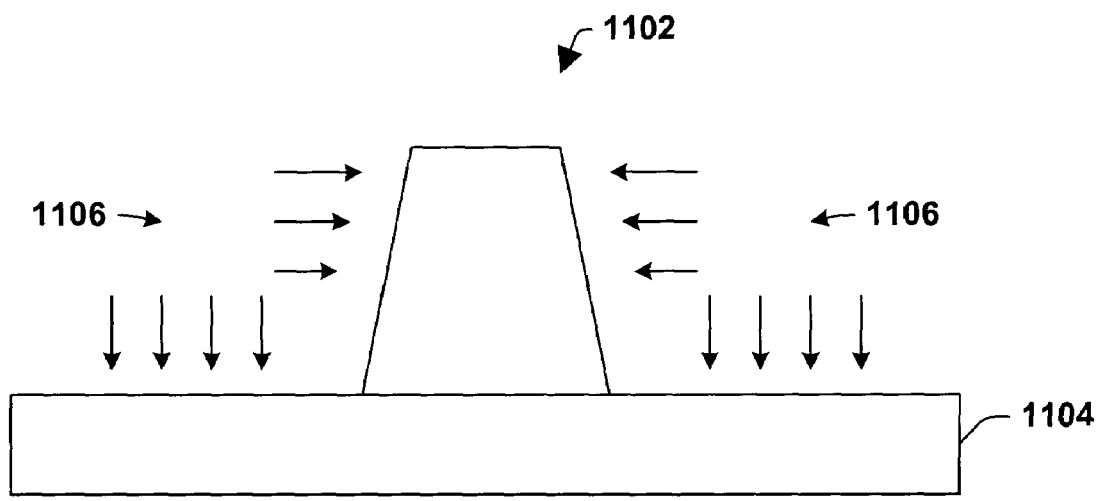

FIG. 11 illustrates a situation where isotropic etching occurs, either due to a lack of passivation material, or to a more isotropic velocity distribution of the ions impinging on the from the plasma. More particularly, a gate structure 1102 is formed upon a substrate 1104 via a dry etching process 1106. The layers of polysilicon material 1108, 1110 from which the gate structure 1102 is formed include carbon that the inventors of the present invention have found changes the formation of passivation material on the sidewalls and increases a horizontal etch component. As such, the etching process 1106 occurs in both the horizontal and vertical directions. Additionally, since upper portions of the layers 1108, 1110 are exposed to the etchant for a longer period of time during the etch process, the gate structure 1102 has somewhat of a trapezoidal cross-section. Such a configuration would be undesirable since the base of the structure would provide additional area for dopants that may diffuse under the gate structure to overlap. This could result in significant capacitive build up and degrade transistor performance.

Figure 12:
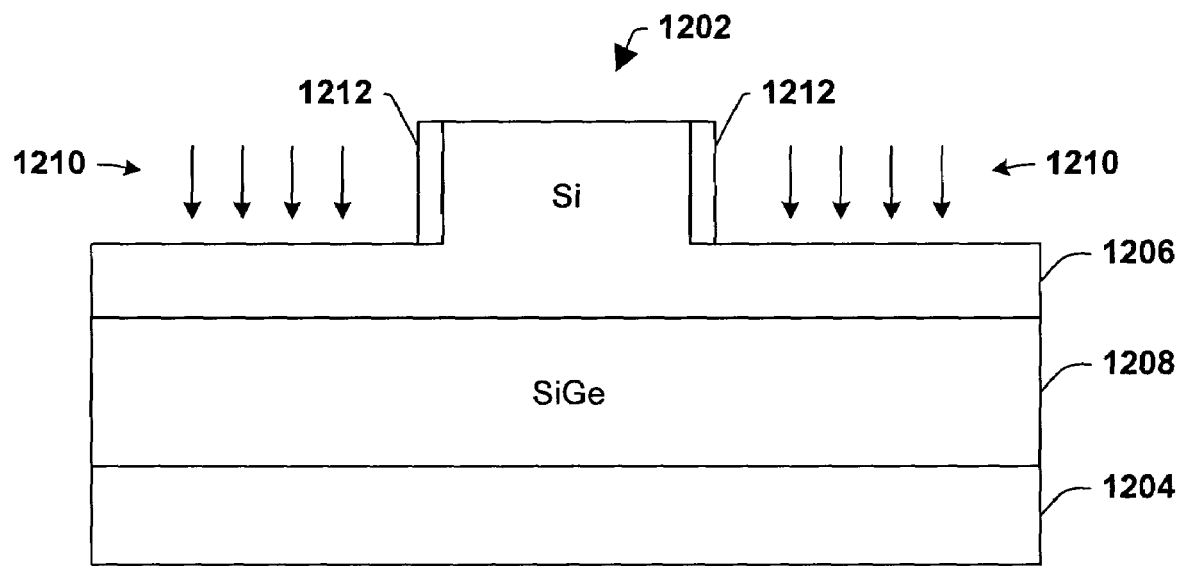
Figure 13:
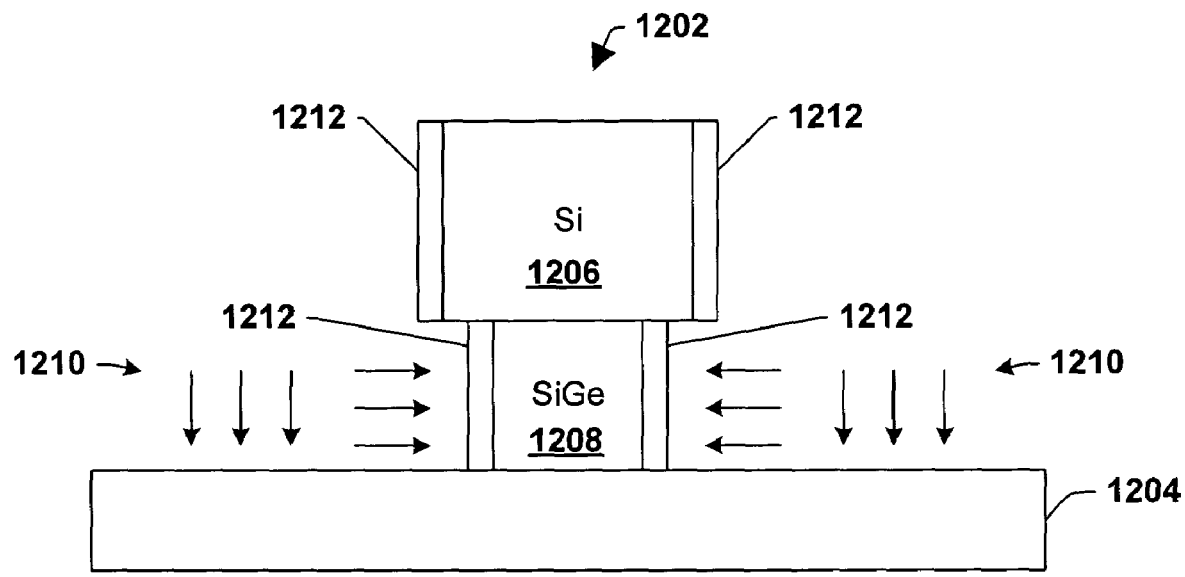

FIGS. 12 and 13 demonstrate that even in the absence of carbon, the type of materials utilized in a gate structure can result in particular gate configurations. In FIG. 12, a gate structure or stack 1202 is being formed upon a substrate 1204. The stack 1202 is formed out of a layer of polysilicon (Si) 1206 that overlies a layer of poly silicon germanium (SiGe) 1208, which in turn overlies a polysilicon seed layer 1210. As a dry etching process 1212 forms the top part of the gate stack 1202 out of the layer of poly-Si 1206, a passivation material 1214 forms on the sidewalls of the stack 1202. As such, the etch process is substantially anisotropic and etches generally in the vertical direction only, and more particularly down toward the substrate 1204.

In the exemplary arrangement depicted in FIG. 13, the etching process has etched through the layer of poly-Si 1206, the layer of poly-SiGe 1208 and the polysilicon seed layer 1210. It can be seen that passivation material 1214 has formed upon the sidewalls of each of the layers 1206, 1208, 1210. However, the poly-SiGe portion of the stack has nevertheless been etched in a horizontal as well as a vertical direction. This is due to the fact that SiGe has a higher susceptibility or sensitivity to the etchant utilized to etch the gate stack even with the existence of the sidewall passivation material 1202. The generally anisotropic etching of the seed layer 1210, however, provides the stack 1202 with a pedestal-like appearance. Such a configuration is not preferred as it provides additional surface area whereby gate to source and/or gate to drain overlap capacitance can develop.

Figure 14:
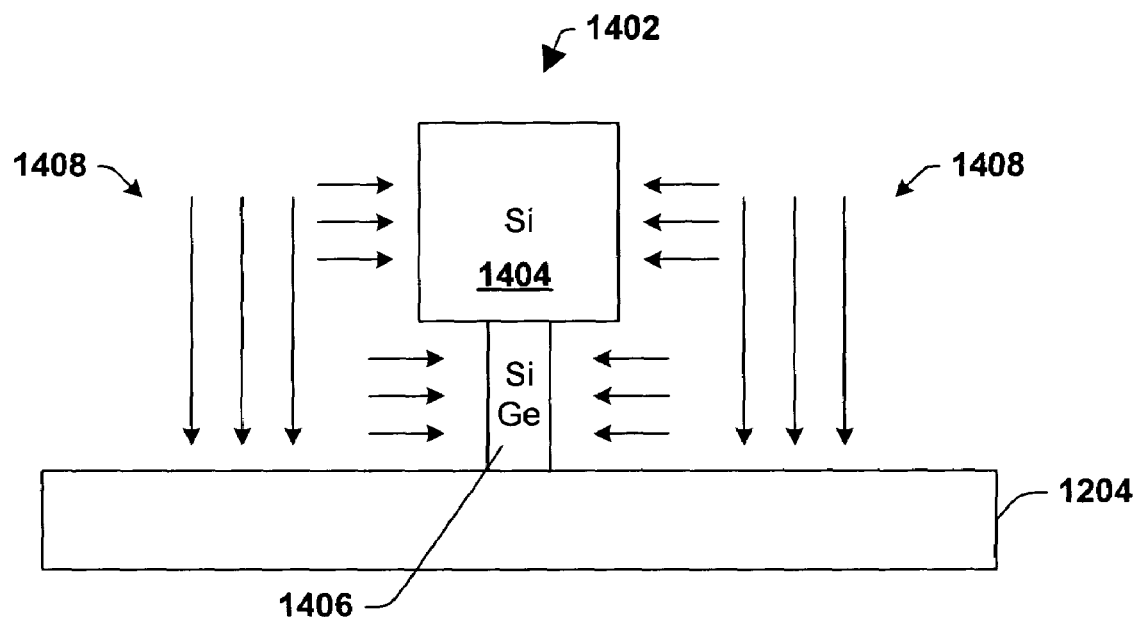

FIG. 14 illustrates a situation where a gate stack 1402 formed on a substrate 1404 comprises poly-Si 1406, poly-SiGe 1408 and a polysilicon seed layer 1410, and each of the layers 1406, 1408 and 1410 further include carbon. In this situation the presence of carbon and the corresponding change in the passivation material on the gate stack 1402 allows an etching process 1412 to etch the gate structure 1402 in both the horizontal and vertical directions. As such, the gate structure 1402 has a somewhat notched appearance as the poly-SiGe portion of the structure 1402 (which is more sensitive to the etchant utilized in the etching process 1410) is etched in the horizontal direction more than the poly-Si portion 1406 and seed layer 1410 of the structure 1402. It will be appreciated, however, that the concentration of carbon may differ among the layers to facilitate various etching profiles. In the illustrated example, for instance, the seed layer 1410 likely has more carbon than the poly-Si and poly-SiGe portions of the stack 1402. In this fashion, the seed layer 1410 is etched substantially in a horizontal direction and any pedestal-like appearance is thereby mitigated. Such a configuration is, desirable as the relatively narrow lower portion of the gate stack 1402 would provide little, if any, area for dopants to overlap should the dopants drift under the stack.

Thus the inventors of the present invention appreciated that by using various amounts of carbon within the gate stack, the degree to which notching and/or pedestal reduction occurs can be selectively manipulated. Further, by controlling the sidewall passivation formation and/or the etch rates using carbon, a difference in the lateral etching of poly-Si, poly-SiGe and a seed layer can be exaggerated and used to minimize overlap capacitance as will be further appreciated below.

Figure 15:
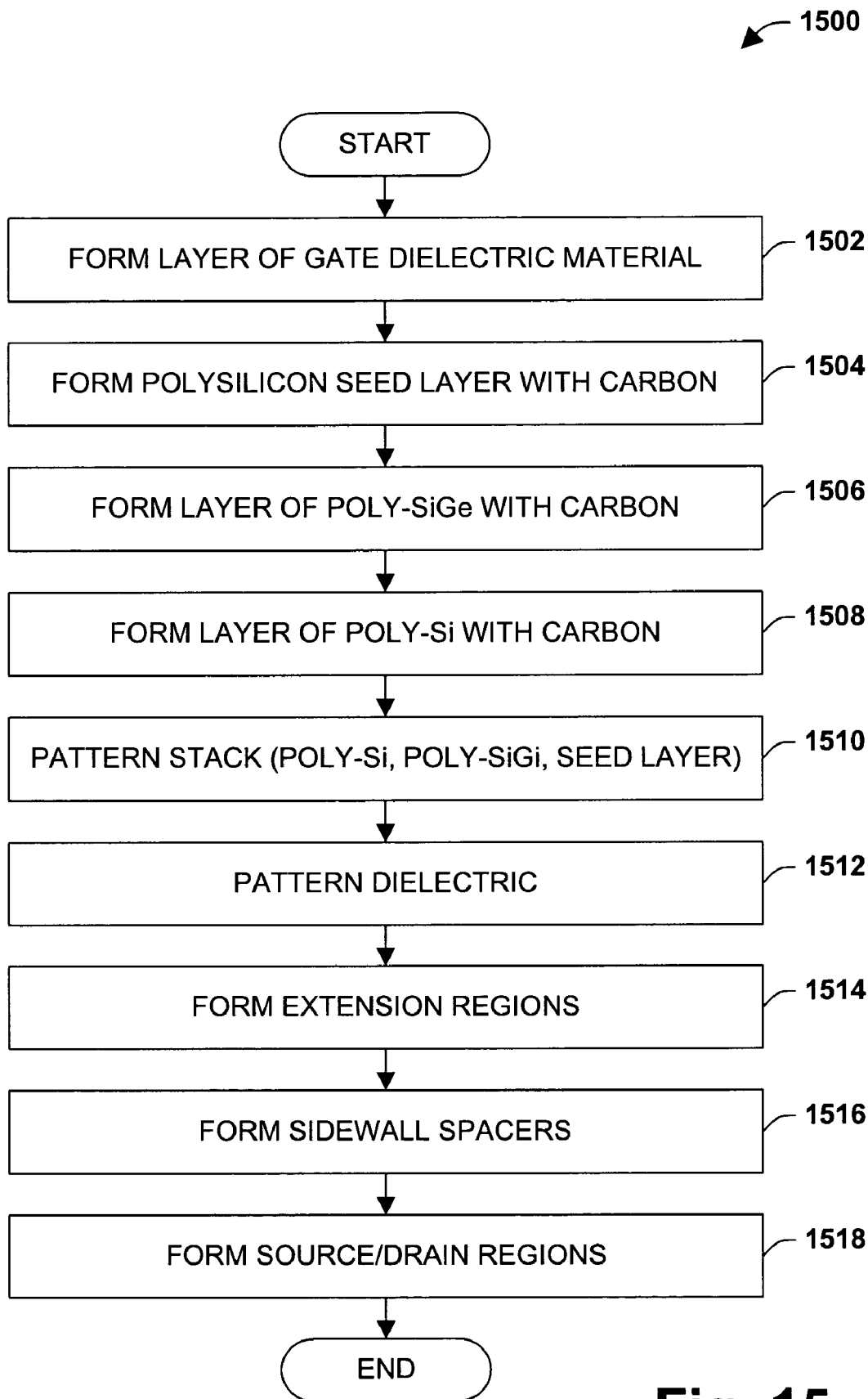
FIG. 15 is a flow diagram illustrating an example of a methodology for forming a transistor in accordance with one or more aspects of the present invention.

Turning now to FIG. 15, a methodology 1500 is illustrated for forming a MOS transistor according to one or more aspects of the present invention. Although the methodology 1500 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated acts may be required to implement a methodology in accordance with one or more aspects of the present invention. Further, one or more of the acts may be carried out in one or more separate acts or phases.

It will be appreciated that a methodology carried out according to one or more aspects of the present invention may be implemented in association with the formation and/or processing of structures illustrated and described herein as well as in association with other structures not illustrated or described herein. By way of example, the method or variants thereof may be used to fabricate a transistor as illustrated and described below with respect to FIGS. 16–25, as well as to devices not shown or described with regard to FIGS. 16–25.

The methodology 1500 begins at 1502 wherein a layer of gate dielectric material is formed over a semiconductor body such as a semiconductor substrate. The layer of gate dielectric material can be applied to the substrate in any number of ways, such as with spin-on techniques, sputtering techniques (e.g., magnetron or ion beam sputtering), growth and/or deposition techniques such as chemical vapor deposition (CVD), for example. The gate dielectric material can be formed to a thickness of about 10 nanometers and can have an equivalent oxide thickness (EOT) of about 10 nanometers or less, for example.

The substrate generally includes silicon and the layer of gate dielectric material can comprise $SiO_2$ or a high-k dielectric material, for example. The layer of gate dielectric material may include, for example, any one or more of the following, either alone or in combination: $S_iO_2$, aluminum oxide ($Al_2O_3$), zirconium silicate, hafnium silicate, hafnium silicon oxynitride, hafnium oxynitride, zirconium oxynitride, ziroconium silicon oxynitride, hafnium silicon nitride, lanthanum oxide ($La_2O_3$), hafnium oxide ($HfO_2$), zirconium oxide ($ZrO_2$), cerium oxide ($CeO_2$), bismuth silicon oxide ($Bi_4Si_2O_{12}$), titanium dioxide ($TiO_2$), tantalum oxide ($Ta_2O_5$), tungsten oxide ($WO_3$), yttrium oxide ($Y_2O_3$), lanthanum aluminum oxide ($LaAlO_3$), barium strontium titanate, barium strontium oxide, barium titanate, strontium titanate, $PbZrO_3$, PST, PZN, PZT and PMN.

At 1504, a polysilicon seed layer is then optionally formed (e.g., deposited) over the layer of gate dielectric material. The polysilicon seed layer may, for example, be formed to a thickness of about 100 Angstroms or less, and facilitates growth of one or more subsequent layers upon the dielectric layer. The polysilicon seed layer is formed with carbon such that the formation of a pedestal during the gate etch process is deterred and notching is increased. The carbon may, for example, be formed in situ within the seed layer so as to be substantially uniformly distributed within the seed layer. In particular, gaseous (or other forms of) carbon can be piped into a processing chamber (e.g., chemical vapor deposition (CVD) chamber) along with other materials so as to be included within the seed layer as that layer is being formed. The amount of carbon within the layer can be controlled by varying the rate and/or volume of carbon allowed to enter the processing chamber relative to other substances as the layer is being formed. Preferably, the seed layer contains at least as much carbon as subsequently formed layers so that the seed layer is etched in a horizontal or vertical direction at least to the same degree as these upper layers to reduce the amount of area for drifting or shifting dopants.

A layer of poly-SiGe is then formed over the seed layer at 1506 (or alternatively directly over the gate dielectric). This layer is similarly formed with carbon to retard the formation of passivation materials thereon during subsequent patterning. The carbon can likewise be formed in situ to provide for uniformity, as well as control over volume and/or flow rates. The layer of poly-SiGe may, for example, be formed to a thickness of about 400 to 700 Angstroms. Preferably, the poly-SiGe layer contains enough carbon to promote a horizontal or lateral etch similar in rate and degree to that of the seed layer. To that extent a content of carbon within the poly-SiGe layer may be slightly less than that within the poly-Si seed layer.

A layer of poly-Si is then formed over the poly-SiGe layer at 1508. As with the seed layer and poly-SiGe layer, the layer of poly-Si includes carbon which can be formed in situ allowing for a substantial degree of control. The layer of poly-Si may, for example, be formed to a thickness of about 350 to 750 Angstroms. Preferably, the concentration of carbon in the poly-Si layer is similar to that of the seed and poly-SiGe layers so that the poly-Si layer experiences horizontal etching. Nevertheless, the poly-SiGe layer may be more sensitive to an etchant utilized, and may therefore etch more quickly than the poly-Si layer.

Alternatively, the poly-Si layer may be formed without carbon therein in accordance with another aspect of the invention. In such a case, subsequent patterning may result with sidewall passivation material forming on the poly-Si with little or no sidewall passivation forming on the poly-SiGe. A concentration of about 0.3 atomic percent carbon is contemplated for the poly-SiGe layer. Such a concentration of carbon may increase the rate of etching rate by about 30 percent, for example. It will be appreciated, however, that other concentrations of carbon can be utilized within the different layers as described herein provided that the included carbon does not become detrimental to the operation of the transistor. By way of example, carbon concentrations in the range of about 0.1 to 1.0 atomic percent may be suitable amounts.

At 1510, the poly-Si, poly-SiGe and polysilicon seed layers are patterned to form a gate structure or stack of the transistor. The stack serves as a contact and provides a means for applying a voltage to the transistor or otherwise biasing the transistor. The layers may, for example, be patterned by a dry etching process. Since in one example the layers all contain carbon, the etching process is generally isotropic and the layers are etched in both horizontal and vertical directions. As noted above, the poly-SiGe layer may etch faster than the other layers due to an enhanced sensitivity to the etchant. Additionally, or alternatively, the rate of etching may vary as a function of various concentrations of carbon. The gate dielectric layer or at least a portion thereof is similarly patterned (e.g., via etching) at 1512 as part of the stack formation.

After the gate structure is formed, the methodology proceeds to 1514 wherein source/drain extension regions are formed within the substrate on either side of the gate structure. The extension regions are precursors to source and drain regions of the transistor. Such extension regions may, for example, be formed according to HDD (highly doped drain) techniques. By way of example, a p-type dopant having a concentration of about 1 to 3E20 atoms/cm$^3$ for a PMOS transistor, or an n-type dopant having concentration of about 7.5 to 9.5E20 atoms/cm$^3$ for an NMOS transistor can be implanted to a depth of about 300–350 Angstroms, for example. It will be appreciated, however, that other implant concentrations and penetration depths are contemplated as falling within the scope of the present invention.

At 1516, sidewall spacers are formed adjacent to the gate stack. Initially, a layer of an insulating material (e.g., silicon nitride, silicon oxide) is formed over the entire structure. The insulating layer can be formed to about 300 to 600 Angstroms, for example, and can be formed in any suitable number of ways, such as with spin-on techniques, sputtering techniques (e.g., magnetron or ion beam sputtering), growth and/or deposition techniques such as chemical vapor deposition (CVD), for example. The layer of insulating material is selectively removed (e.g., via dry etching) to form the sidewall spacers on either side of the gate structure. The sidewall spacers cover portions of the extension regions and deter subsequently applied dopant from entering these regions. It will be appreciated that the sidewall spacers can be formed out of any suitable materials alone or in combination. For example, the sidewall spacers may be formed out of multi-layers of materials including, but not limited to, silicon nitride and silicon oxide.

Then, at 1518, additional n or p type dopant is applied to establish source and drain regions within the substrate on either side of the gate structure. It will be appreciated that the additional dopant is preferably of substantially the same type as that previously applied in forming the extension regions. A channel region is thereby defined within the substrate under the gate structure as the source and drain regions are formed.

Although not illustrated, it will be appreciated that at some point in the formation of the transistor, one or more heat treatments are employed to, among other things, activate implanted dopants. This heat treatment may cause some of the implanted dopants to migrate toward the channel. Forming the transistor according to the methodology described herein mitigates capacitive effects that can arise between the activated dopants and the nonconductive gate dielectric material and the conductive gate electrode or stack materials as there is little, if any, overlap between the dopants and the stack materials.

As mentioned above, not all illustrated acts may be required to implement a methodology in accordance with one or more aspects of the present invention. For example, the methodology may omit SiGe in the gate stack, and thus pertain to an all polysilicon gate structure. In such a situation, incorporating a controlled amount of carbon into a lower portion of the gate structure would allow the bottom portion of the gate structure to be drawn-in during etching and have a notched or tapered configuration. In this manner, overlap capacitance would once again be mitigated as surface area would be substantially reduced toward the bottom of the gate structure.

Figure 16:
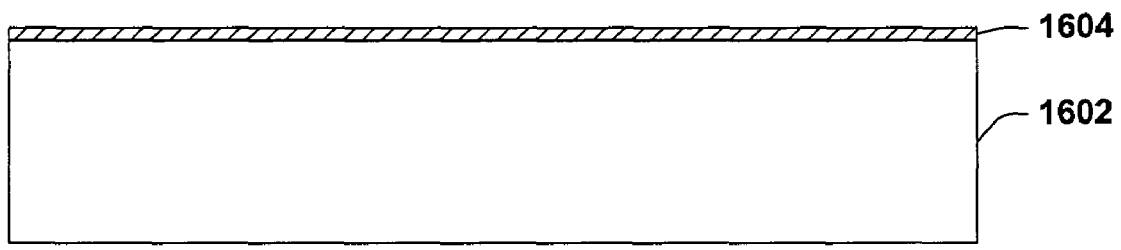
FIGS. 16–25 are cross-sectional illustrations of a transistor formed according to one or more aspects of the present invention.

Turning now to FIGS. 16–25, an exemplary technique for forming a transistor is disclosed. Initially, a layer of gate dielectric material 1604 is formed upon a semiconductor substrate 1602 (FIG. 16). It is to be appreciated that the term "semiconductor substrate" as used herein can include a base semiconductor wafer (e.g., silicon, SiGe, or an SOI wafer) and any epitaxial layers or other type semiconductor layers formed thereover or associated therewith. It is to be further appreciated that elements and/or layers depicted herein are illustrated with particular dimensions relative to one another (e.g., layer to layer dimensions and/or orientations) for purposes of simplicity and ease of understanding, and that actual dimensions of the elements/layers may differ substantially from that illustrated herein.

The layer of gate dielectric material 1604 can include any of a number of suitable materials. Some examples include silicon dioxide, high-k materials, or a stack of such layers. It will be appreciated that the layer of gate dielectric material 1604 can be formed across the substrate 1602 in any of a number of suitable manners, including, for example, sputtering techniques (e.g., magnetron or ion beam sputtering), growth and/or deposition techniques, such as chemical vapor deposition (CVD). The layer of gate dielectric material can be formed to a thickness of about 10 nanometers or more to mitigate "tunneling", and can have an equivalent oxide thickness (EOT) of about 10 nanometers or less, for example, so as to maintain and exhibit desired electrical properties. A dielectric material having a k of about 7.8 and a thickness of about 10 nm, for example, is substantially electrically equivalent to an oxide gate dielectric having a k of about 3.9 and a thickness of about 5 nm.

Figure 17:
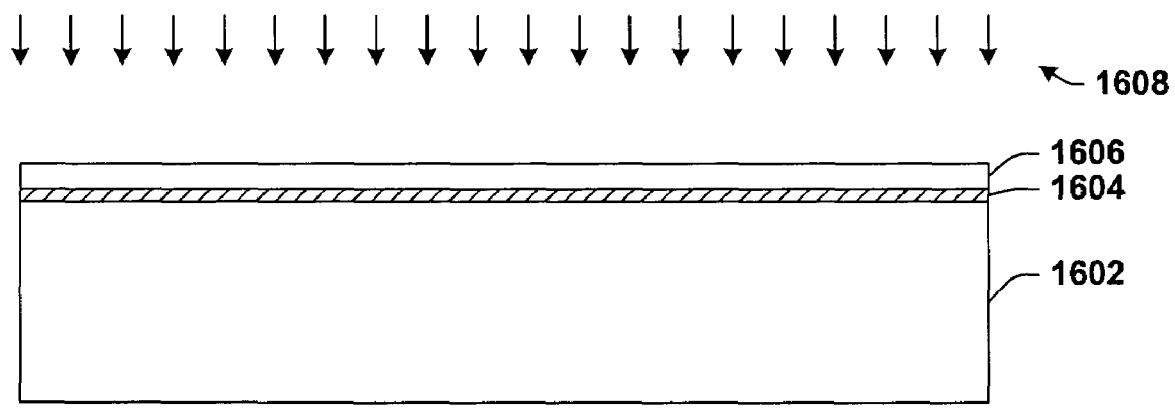

A polysilicon seed layer 1606 is then optionally formed (e.g., deposited) over the layer of gate dielectric material 1604 (FIG. 17). The polysilicon seed layer 1606 may, for example, be formed to a thickness of about 100 Angstroms or less, and facilitates growth of one or more subsequent layers upon the dielectric layer. The polysilicon seed layer 1606 is formed with carbon 1608 such that enhanced horizontal etching is achieved during a subsequent etching process. The carbon 1608 may, for example, be formed in situ within the seed layer 1606 so as to be substantially uniformly distributed within the seed layer 1606. In particular, gaseous (or other forms of) carbon 1608 can be piped into a processing chamber (not shown) (e.g., chemical vapor deposition (CVD) chamber) along with other materials so as to be included within the seed layer as that layer is being formed. The amount of carbon within the seed layer can be controlled by varying the rate and/or volume of carbon allowed to enter the processing chamber relative to other substances. Preferably, the seed layer 1606 contains at least as much carbon as subsequently formed layers so that the seed layer 1606 is etched in a horizontal or vertical direction at least to the same extent as the other layers. In this manner, the amount of seed layer 1606 for drifting or shifting dopants to overlap is reduced.

Figure 18:
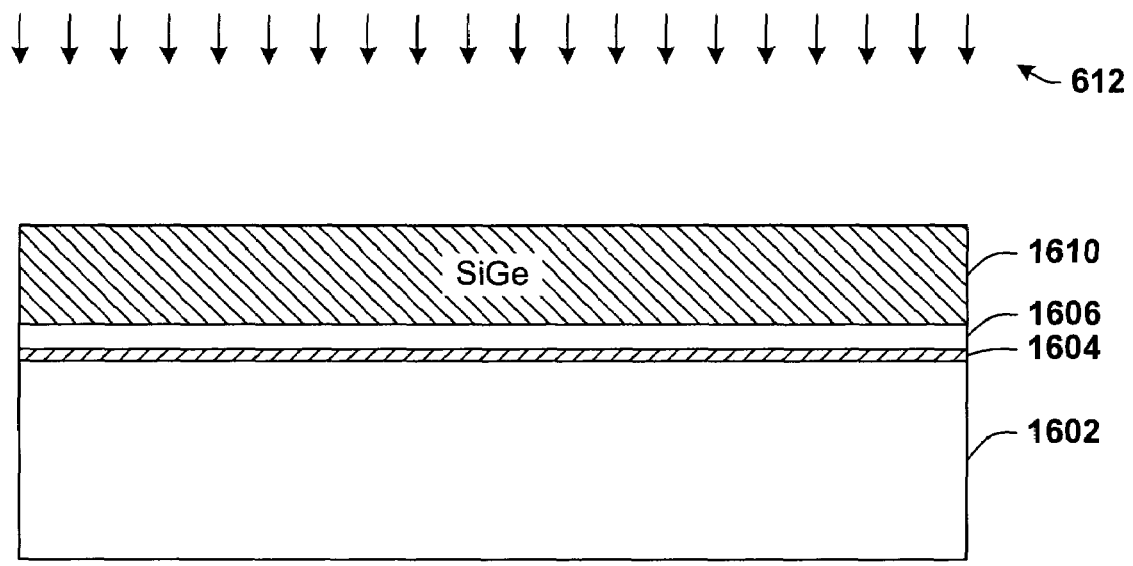

A layer of poly-SiGe 1610 is then formed over the seed layer 1606 (FIG. 18). This layer 1610 is similarly formed with carbon 1612 to enhance the horizontal etching component. The carbon 612 can likewise be formed in situ to provide for uniformity, as well as control over volume and/or flow rates. The layer of poly-SiGe 1610 may, for example, be formed to a thickness of about 400 to 700 Angstroms. Preferably, the poly-SiGe 1610 layer contains enough carbon 1612 to promote a horizontal or lateral etch similar in rate and degree to that of the seed layer 1606.

Figure 19:
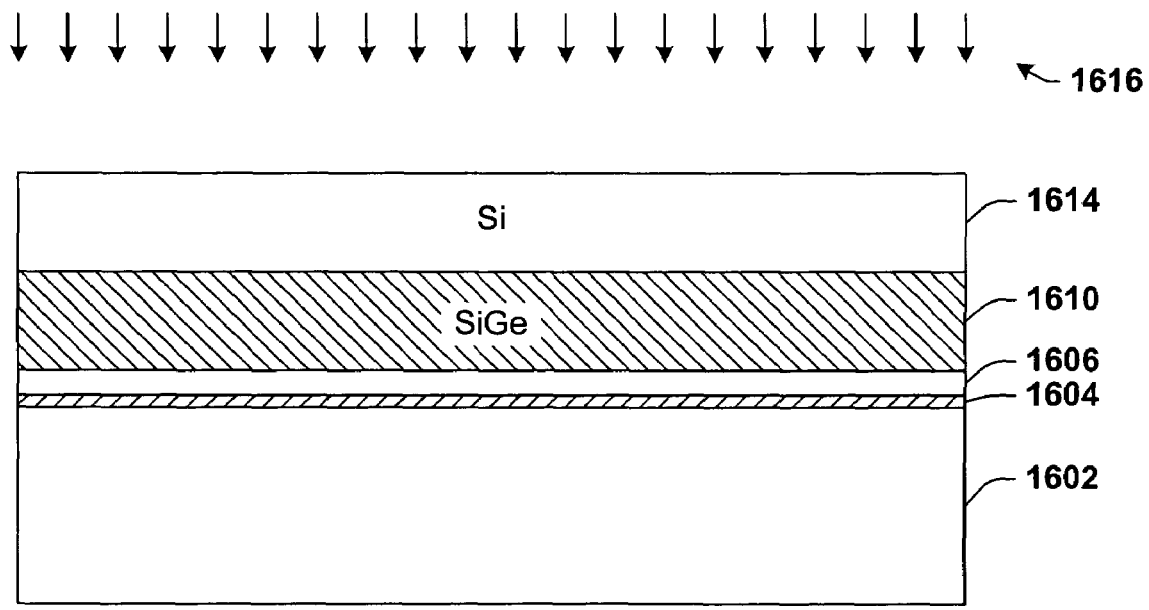

A layer of poly-Si 1614 is then formed over the poly-SiGe layer 1610 (FIG. 19). As with the seed layer 1606 and poly-SiGe layer 1610, the layer of poly-Si 1614 includes carbon 1616 which can be formed in situ allowing for a substantial degree of control. The layer of poly-Si 1614 may, for example, be formed to a thickness of about 350 to 750 Angstroms. Preferably, the concentration of carbon 1616 in the poly-Si layer 1614 is similar to that of the seed 1606 and poly-SiGe 1610 layers so that the poly-Si 1614 layer experiences horizontal etching similar to that of the seed 1606 and poly-SiGe 1610 layers. Nevertheless, the poly-SiGe layer 1610 may be more sensitive to an etchant utilized, and may therefore etch more quickly than the poly-Si layer 1614.

Alternatively, the poly-Si may be formed without carbon. In such a case, subsequent patterning may result with sidewall passivation material forming on the poly-Si with little or no sidewall passivation forming on the poly-SiGe. A concentration of about 0.3 atomic percent carbon is contemplated for the poly-SiGe layer. Such a concentration of carbon may increase the rate of etching rate by about 30 percent, for example. It will be appreciated, however, that other concentrations of carbon can be utilized within the different layers as described herein provided that the included carbon does not become detrimental to the operation of the transistor. By way of example, carbon concentrations in the range of about 0.1 to 1.0 atomic percent may be suitable.

Figure 20:
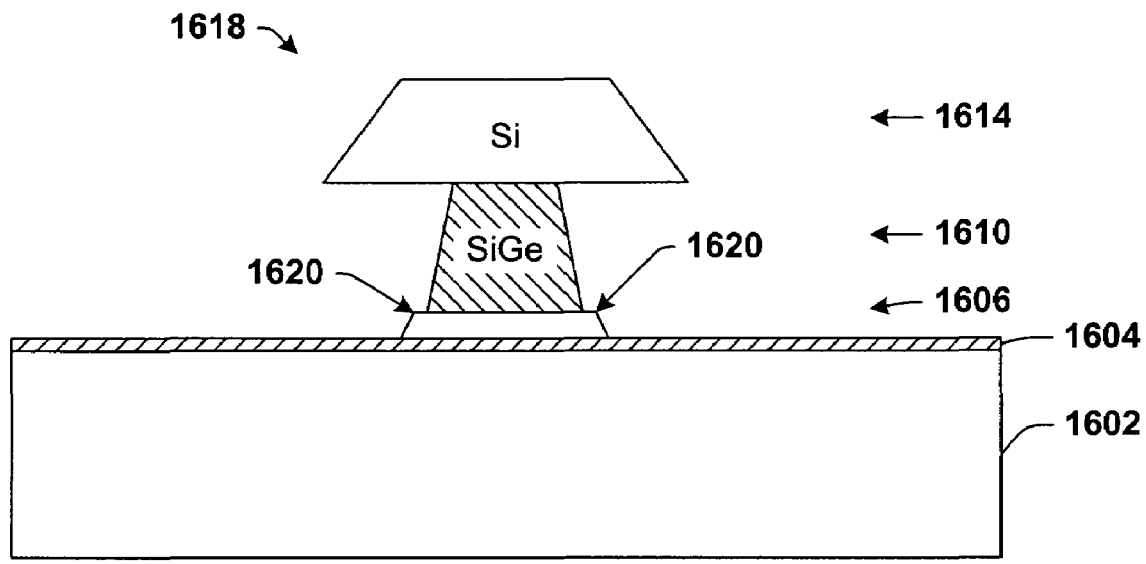
Figure 21:
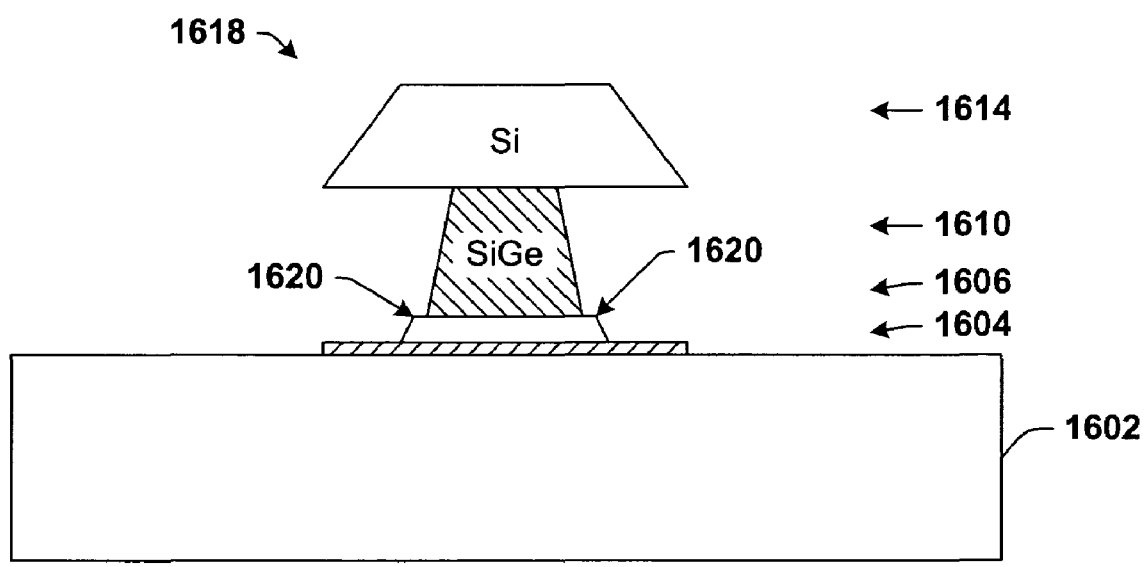

The poly-Si, poly-SiGe and polysilicon seed layers 1606, 1610, 1614 are then patterned to form a transistor gate structure or stack 1618 (FIG. 20). The stack 1618 serves as a contact and provides a means for applying a voltage to the transistor or otherwise biasing the transistor. The layers 1606, 1610, 1614 may, for example, be patterned by a dry etching process. Since, in the present example, the layers all contain carbon, the etching process is more isotropic and the layers are etched in both horizontal and vertical directions. As noted above, the poly-SiGe layer 1610 will etch faster than the other layers due to an enhanced sensitivity to an etchant. Additionally, the rate of etching will vary as a function of various concentrations of carbon. Accordingly, in the illustrated example, the layers of the gate stack are depicted as having substantially trapezoidal shapes with portions 1620 of the seed layer 1606 jutting out slightly more than the tapered poly-SiGe layer 1610, giving the seed layer 1610 somewhat of a pedestal-like appearance. This may, for example, be indicative of an increased sensitivity of the poly-SiGe layer 1610 to a particular etchant utilized. It will be appreciated, however, that infusing the seed layer 1606 with additional carbon and/or utilizing different etchant(s) may allow such portions 1620 to be mitigated. The gate dielectric layer 1604 may then be patterned (e.g., via etching) as part of the gate stack formation (FIG. 21), however, in some cases the gate dielectric layer 1604 is not completely etched until later and only a portion thereof is impacted by the gate etch.

Figure 22:
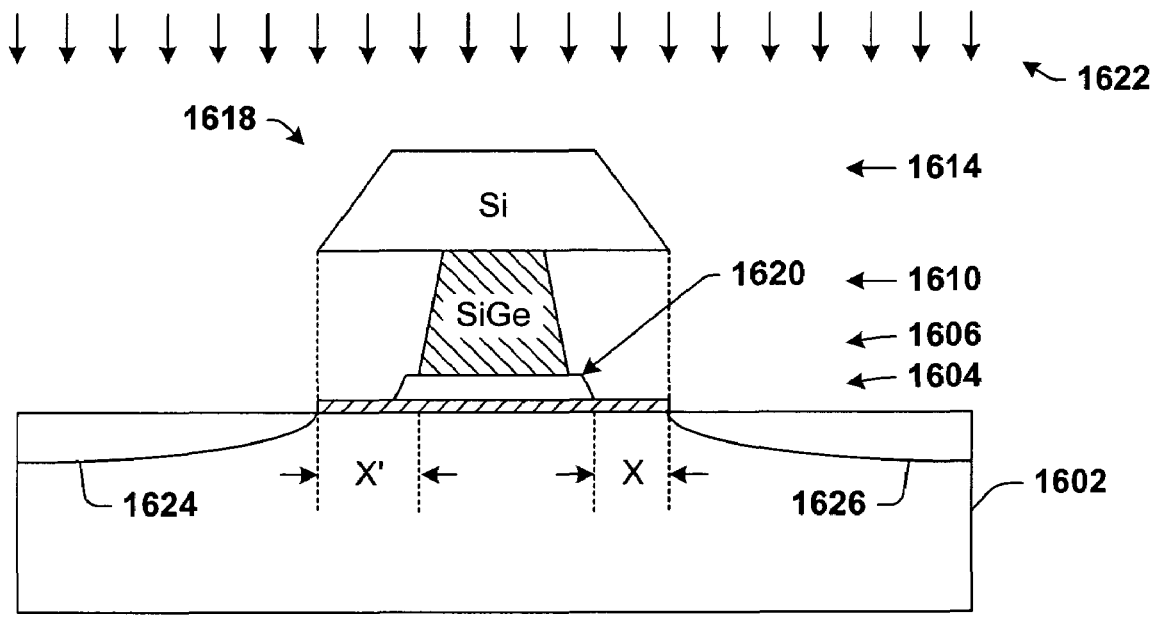

After the gate structure 1618 is formed, a dopant 1622 as added to form source/drain extension regions 1624, 1626 within the substrate 1602 on either side of the gate structure 1618 (FIG. 22). The extension regions 1624, 1626 are precursors to source and drain regions of the transistor. Such extension regions 1624, 1626 may, for example, be formed according to HDD (highly doped drain) techniques. By way of example, a p-type dopant having a concentration of about 1 to 3E20 atoms/cm$^3$ for a PMOS transistor, or an n-type dopant having concentration of about 7.5 to 9.5E20 atoms/cm$^3$ for an NMOS transistor can be implanted to a depth of about 300–350 Angstroms, for example. It will be appreciated, however, that other implant concentrations and penetration depths are contemplated as falling within the scope of the present invention. It can be seen that since, in the illustrated example, the different layers are etched to different degrees due to different carbon concentrations and/or sensitivities to one or more etchants, the dopant 1622 can migrate under the gate structure a distance X before potentially overlapping any of the seed layer 1606. Similarly, the notched configuration of the gate structure 1618 allows the dopants 1622 to drift an even greater distance X' under the stack before potentially overlapping any of the poly-SiGe layer 1610.

Figure 23:
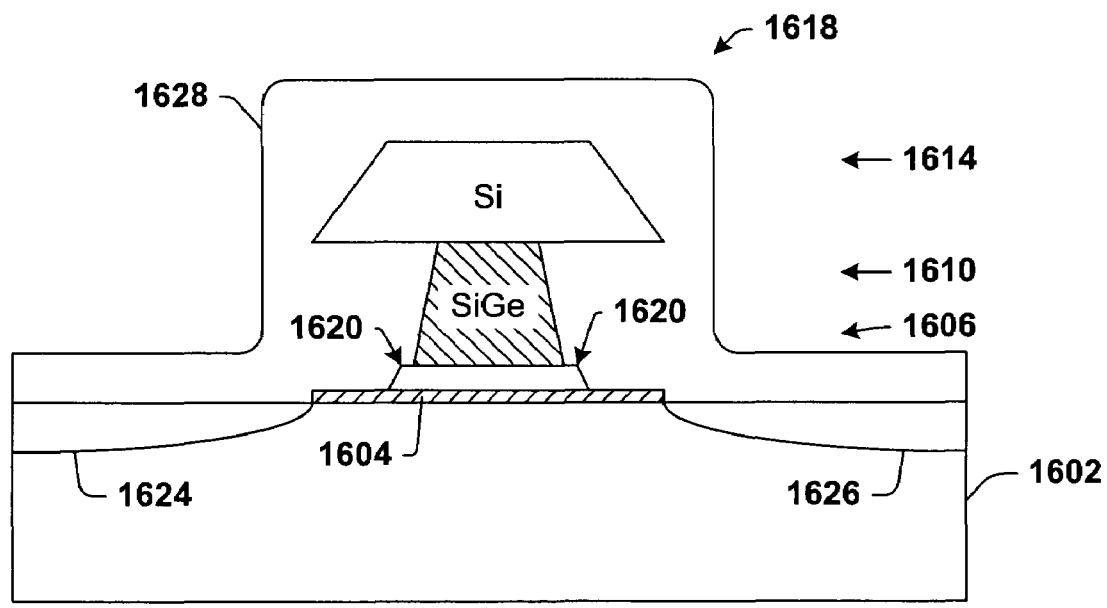
Figure 24:
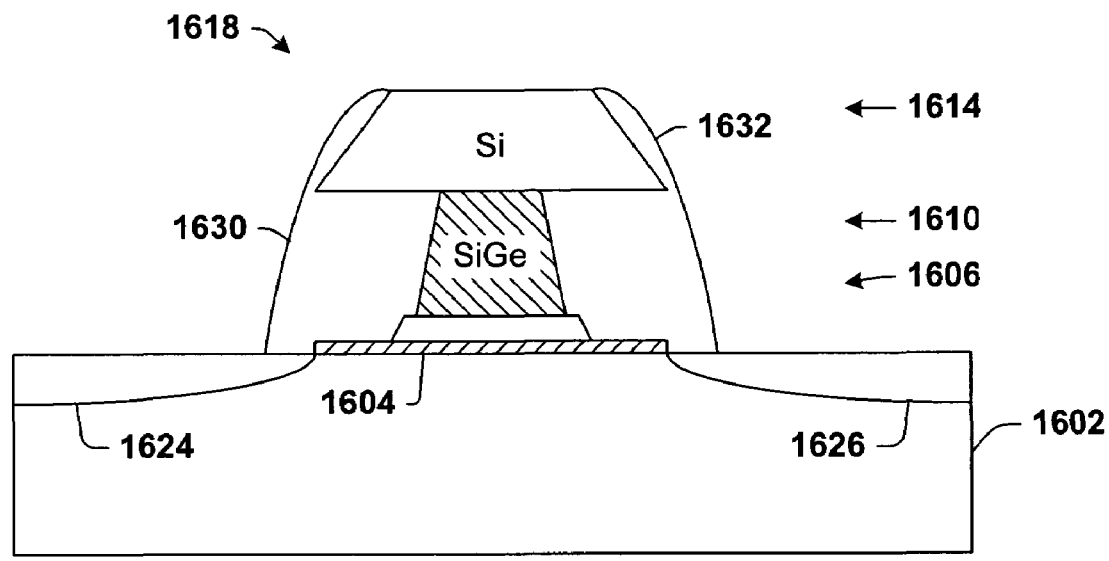

A layer 1628 of an insulating material (e.g., silicon nitride, silicon oxide) is then formed over the entire structure (FIG. 23). The insulating layer 1628 can be formed to about 300 to 600 Angstroms, for example, and can be formed in any suitable number of ways, such as with spin-on techniques, sputtering techniques (e.g., magnetron or ion beam sputtering), growth and/or deposition techniques such as chemical vapor deposition (CVD), for example. The layer of insulating material 1628 is selectively removed (e.g., via dry etching, chemical mechanical polishing (CMP), other suitable reduction techniques) to form sidewall spacers 1630, 1632 on either side of the gate structure 1618 (FIG. 24). Such sidewall spacers 1630, 1632 can have a width of about 400 to 700 Angstroms, for example. The sidewall spacers 1630, 1632 cover portions of the extension 1624, 1626 regions and deter subsequently applied dopant from entering these regions 1624, 1626. It will be appreciated that the sidewall spacers can be formed out of any suitable materials alone or in combination. For example, the sidewall spacers may be formed out of multi-layers of materials including, but not limited to, silicon nitride and silicon oxide.

Figure 25:
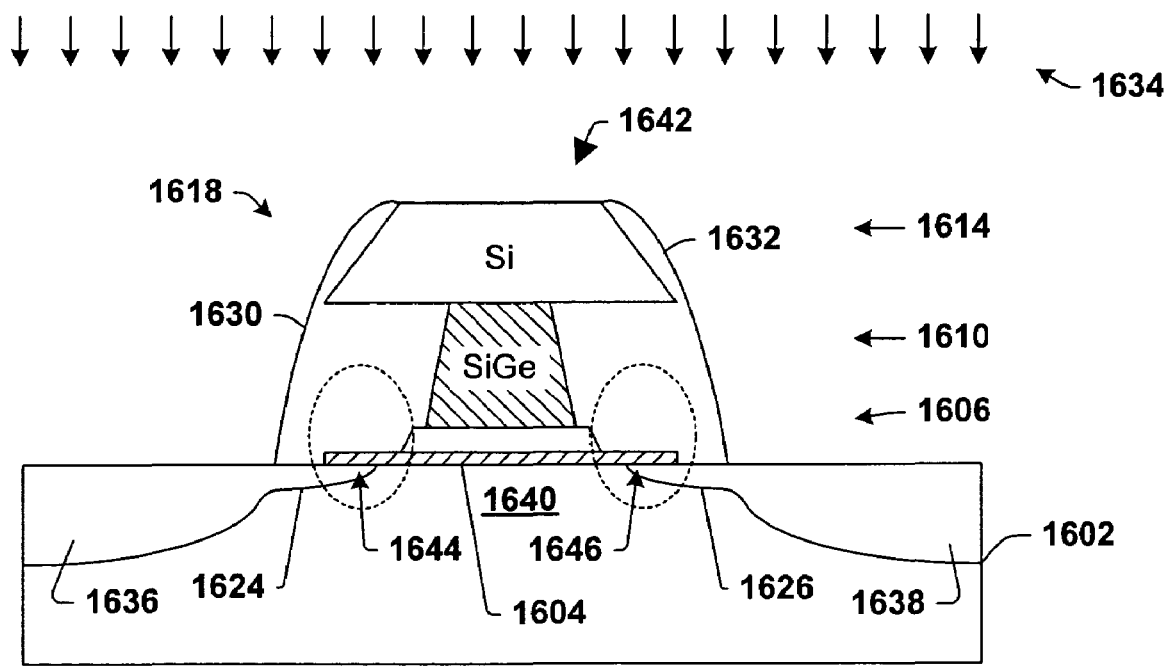

Then, additional n or p type dopant 1634 is applied to establish source and drain regions 1636, 1638 within the substrate 1602 on either side of the gate structure 1618 (FIG. 25). It will be appreciated that the additional dopant 1634 is preferably of substantially the same type as that previously applied in forming the extension regions 1624, 1626. It will be further appreciated that in forming the source and drain regions 1636, 1638, the additional dopant 1634 is implanted to greater depth in the substrate (e.g., with a greater energy) relative to the source and drain extension regions 1624, 1626. A channel region 1640 is thereby defined within the substrate 1602 under the gate structure 1618, and the final transistor 1642 results.

Although not illustrated, it will be appreciated that at some point in forming the transistor 1642, one or more heat treatments may be employed to, among other things, activate implanted dopants. This heat treatment may cause some of the implanted dopants to migrate toward the channel 1640. Forming the transistor 1642 in the manner described herein mitigates capacitive effects that can arise between the activated dopants and the nonconductive gate dielectric material 1604 and the conductive gate electrode or stack materials 1610, 1614 since there is little, if any, opportunity for overlap between dopants that migrate under the stack 1618 and the other layers 1604, 1610, 1614. In particular, portions 1644, 1646 of the extension regions 1624, 1626 can migrate a significant distance under the gate stack 1618 before overlapping any of the poly-SiGe layer 1610, and any overlap with the gate dielectric material 1604 and/or the seed layer 1606 has negligible effects. The areas where overlap may occur, but is mitigated in accordance with what is described herein, are encircled in phantom in FIG. 25.

It will be further appreciated that while the gate stack 1618 has been discussed herein as including a layer of SiGe 1610, aspects of the present invention contemplate an all polysilicon gate structure where germanium is absent. In such a situation, incorporating a controlled amount of carbon in a lower portion of the gate structure would allow the bottom portion of the gate structure to be drawn-in during etching and have a notched or tapered configuration. In this manner, overlap capacitance would once again be mitigated as surface area would be substantially reduced toward the bottom of the gate structure.

Figure 26:
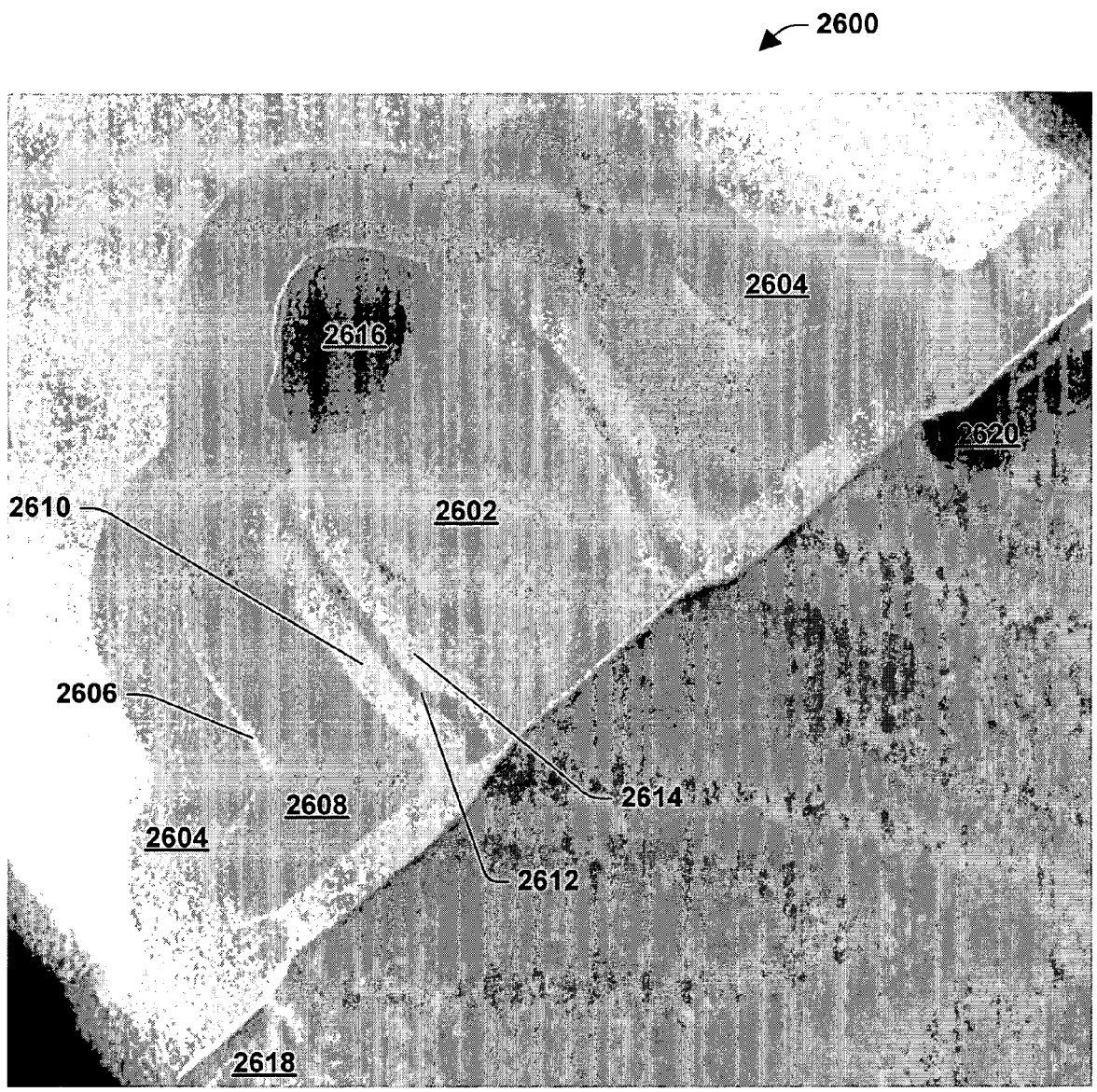
FIGS. 26–29 are scattering electron microscope (SEM) images of a transistor illustrating several aspects of the present invention.

Turning to FIGS. 26–29, electron microscope images of actual transistors are depicted to illustrate one or more aspects of the present invention. FIG. 26 is a transmission electron microscopy (TEM) image of a conventional poly-Si transistor 2600, where the gate structure 2602 does not contain poly-SiGe or carbon. Accordingly, the gate structure 2602 has a substantially rectangular cross-section (e.g., as in FIG. 10). From left to right, the transistor 2600 includes a pmv or pre-metallization encapsulation liner 2604 that is formed over the entire structure. This layer 2604 may, for example, be about 300 Angstroms thick and generally includes a nitride. The transistor 2600 then includes a thin tetraethyl orthosilicate (TEOS) oxide 2606 overlying a multi-layer sidewall spacer that includes an L shaped nitride 2608 and an L shaped oxide 2610. An offset nitride 2612 and an oxide spacer 2614 abut the gate stack 2602. Also, the top of the gate structure 2602 includes a silicided region 2616. Source and drain regions 2618, 2620 of the transistor 2600 are likewise silicided.

Figure 27:
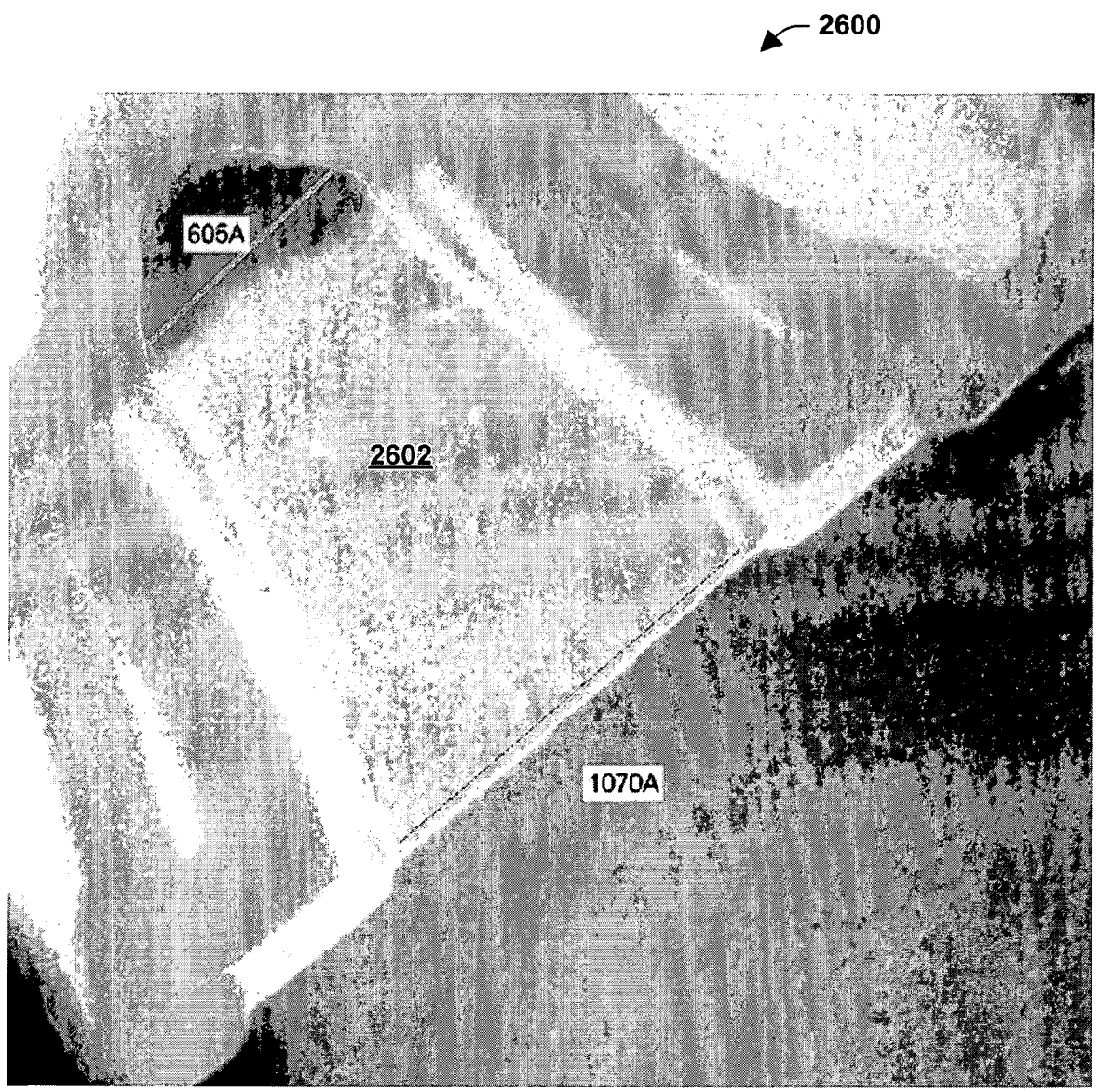

FIG. 27 illustrates a situation where the poly-Si gate structure 2602 includes about 0.3 percent carbon. Accordingly, the passivation and etch rates are affected by the carbon resulting a more isotropic etch profile. The gate structure thus has a substantially trapezoidal cross-section (e.g., as in FIG. 11).

Figure 28:

In FIG. 28, the gate stack 2602 includes a seed layer 2622, a poly-SiGe layer 2624 and a poly-Si layer 2626, where a portion of the poly-Si layer 2626 includes the silicided region 2616. The seed layer 2622 has a thickness of about 50 Angstroms, the poly-SiGe layer 2624 has a thickness of about 650 Angstroms and the poly-Si layer 2626 has a thickness of about 500 Angstroms, for example. Even though none of the layers include carbon, it can be seen that the poly-SiGe layer 2624 is more sensitive to the etchant utilized and is thus narrower than the other layers 2622, 2626 (e.g., as in FIG. 13). The seed layer 2622 can thus be said to have somewhat of a pedestal-like appearance.

Figure 29:
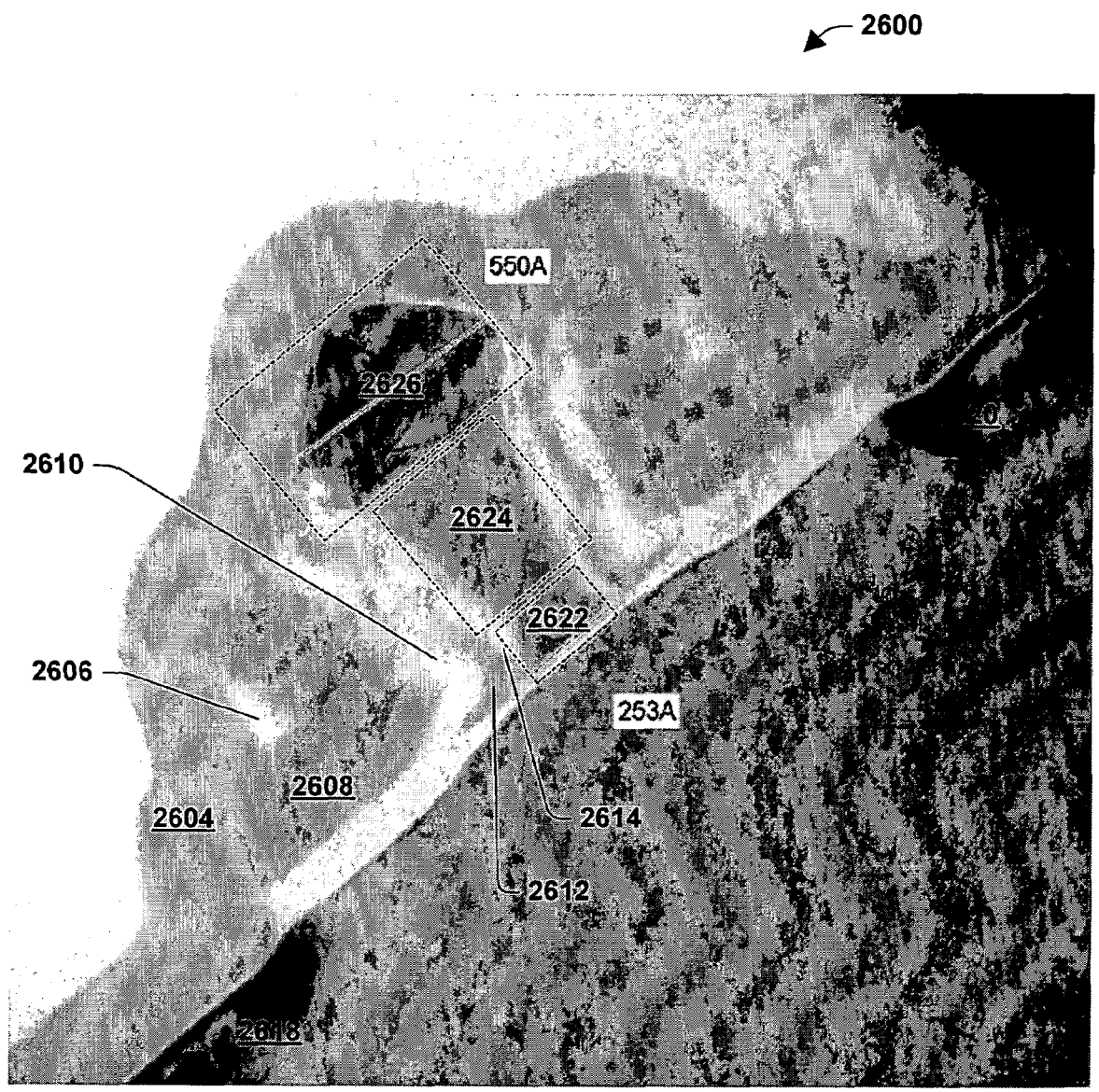

FIG. 29 is similar to the situation presented in FIG. 28 except that the entire stack includes about 0.3 percent carbon to change the formation of passivation materials and etch rate causing more isotropic etching. It will be appreciated that such a concentration of carbon can enhance etching by about 30 percent. Accordingly, the approximately 50 Angstrom seed layer 2622 is narrower than that depicted in FIG. 28. Similarly, the approximately 650 Angstrom poly-SiGe layer 2624 and the approximately 500 Angstrom poly-Si layer 2626 are narrower than their respective counterparts in FIG. 28 (e.g., as in FIG. 14). The seed layer 2622 thus has less of a pedestal-like appearance.

Accordingly, it can be appreciated that the extent of notching within a transistor can be engineered according to what has been described herein by varying the carbon content of the poly-SiGe and/or poly-Si layers, while the height of the notched area can be engineered by varying the thickness of the carbon engendered polySiGe and/or poly-Si layers. It can be further appreciated that incorporating carbon into the seed layer allows a pedestal-like configuration to be mitigated.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of forming a transistor having source and drain regions within a substrate adjacent a gate stack on the substrate, comprising:

forming a layer of poly-SiGe with carbon over a dielectric layer situated on the substrate;

forming a polysilicon seed layer over the dielectric layer;

forming a layer of poly-Si over the layer of poly-SiGe; and patterning the poly-Si, poly-SiGe and dielectric layers to form the gate stack;

wherein the polysilicon seed layer is patterned in forming the gate stack.

2. The method of claim 1, wherein the layer of poly-Si includes carbon.

3. The method of claim 1, wherein the seed layer includes carbon.

4. The method of claim 3, wherein the poly-Si, poly-SiGe and seed layers are patterned via an etching process.

5. The method of claim 4, wherein the carbon within the layers changes a passivation material formation and etch rate during the etching process.

6. The method of claim 5, wherein the etching is substantially isotropic due to the change in passivation and etch rate.

7. The method of claim 6, wherein the poly-SiGe layer has a greater etch sensitivity to an etchant utilized to etch the layers in forming the gate structure.

8. The method of claim 7, wherein at least one of the seed layer, poly-SiGe layer and poly-Si layer contains a concentration of carbon between about 0.1 to 1.0 atomic percent.

9. The method of claim 1, wherein the seed layer has a thickness of about 100 Angstroms or less.

10. The method of claim 1, wherein the poly-SiGe layer has a thickness of about 400 to 700 Angstroms.

11. The method of claim 1, wherein the poly-Si layer has a thickness of about 350 to 750 Angstroms.

12. The method of claim 1, wherein the dielectric layer has a thickness of about 100 Angstroms.

13. The method of claim 3, wherein at least one of the dielectric layer, seed layer, poly-SiGe layer and poly-Si layer is formed according to at least one of spin-on techniques, sputtering techniques, growth techniques and deposition techniques.

14. A method of forming a transistor, comprising:
forming a layer of dielectric material over a substrate;
forming a layer of poly-SiGe with carbon over a dielectric layer situated on the substrate;
forming a layer of poly-Si over the layer of poly-SiGe;
patterning the poly-Si, poly-SiGe and dielectric layers to form a gate stack; doping exposed portions of the substrate adjacent to the gate stack to form source and drain regions;
forming a polysilicon seed layer over the layer of dielectric material; and
patterning the polysilicon seed layer in forming the gate stack.

15. A method of forming a transistor, comprising:
forming a layer of dielectric material over a substrate;
forming a layer of poly-SiGe with carbon over a dielectric layer situated on the substrate;
forming a layer of poly-Si over the layer of poly-SiGe, wherein the layer of poly-Si includes carbon;
patterning the poly-Si, poly-SiGe and dielectric layers to form a gate stack;
doping exposed portions of the substrate adjacent to the gate stack to form source and drain regions;
forming a polysilicon seed layer over the dielectric layer; and
patterning the polysilicon seed layer in forming the gate stack.

16. The method of claim 15, wherein the seed layer includes carbon.

17. The method of claim 16, wherein the poly-Si, poly-SiGe and seed layers are patterned via an etching process, and wherein the poly-SiGe layer has a greater etch sensitivity to an etchant utilized to etch the layers.

18. The method of claim 16, wherein at least one of the seed layer, poly-SiGe layer and poly-Si layer contains a concentration of carbon between about 0.1 to 1.0 atomic percent.

19. The method of claim 15, wherein the seed layer has a thickness of about 100 Angstroms or less.

* * * * *